United States Patent [19]

Feldtkeller

[11] 4,269,483

[45] May 26, 1981

[54] ELECTRO-OPTICAL VOLTAGE MEASUREMENT DEVICE

[75] Inventor: Ernst Feldtkeller, Munich, Fed. Rep. of Germany

[73] Assignee: Siemens Aktiengesellschaft, Berlin & Munich, Fed. Rep. of Germany

[21] Appl. No.: 82,695

[22] Filed: Oct. 9, 1979

[30] Foreign Application Priority Data

Oct. 19, 1978 [DE] Fed. Rep. of Germany ....... 2845625

[51] Int. Cl.³ .......................................... G01R 31/00
[52] U.S. Cl. ..................... 350/390; 324/96; 350/393; 356/368
[58] Field of Search ..................... 350/150, 151, 96.29; 356/368; 324/96

[56] References Cited

U.S. PATENT DOCUMENTS

| | | | |
|---|---|---|---|
| 3,810,013 | 5/1974 | Müller | 350/150 |
| 3,936,742 | 2/1976 | Krause | 324/96 |
| 4,070,620 | 1/1978 | Feldtkeller et al. | 324/96 |
| 4,070,622 | 1/1978 | Harms et al. | 350/151 |

FOREIGN PATENT DOCUMENTS

2821642 11/1978 Fed. Rep. of Germany ........ 350/96.34

OTHER PUBLICATIONS

J.T.A. Pollock, "Filamentary Sapphire, Parts 1, 2 and 3", *Journal of Materials Science*, vol. 7, (1972), pp. 631-648, 649-653, 787-792.

"IRE Standards on Piezoelectric Crystals", *Proceedings of the IRE*, vol. 46, Apr. 1958, pp. 764-778.

Harms et al., "Automatic Recording of Faraday Rotation and Circular Dichroism", *Rev. Sci. Instrum.*, vol. 44, No. 6, Jun. 1973, pp. 742-743.

Jaecklin, Henry A., "Measuring Currents at Extra High Voltages", *Laser Focus*, May 1970, pp. 35-38.

Rogers, A. J., "Optical Methods for Measurement of Voltage and Current at High Voltage", *AIM Leige Traitement des Donnees*, 1977, pp. 1-12.

*Primary Examiner*—R. A. Rosenberger
*Attorney, Agent, or Firm*—Hill, Van Santen, Steadman, Chiara & Simpson

[57] ABSTRACT

A device for electro-optically measuring a voltage in a high-voltage conductor, which voltage will produce an electrical field that will elliptically polarize both a linearly polarized light beam or a circularly polarized light beam, the device having a transmitter providing a source of light as a light beam, polarizer for the light beam, a head section at the high-voltage conductor and a receiver on a base which is spaced from the head section, said receiver having a device for measuring the voltage due to a phase difference between the components of the light beams passing with different transit speeds, characterized by the transmitter being on the base, a supply line extending from the source to the head and at least one return line for conducting the light beam having a desired polarization, which is either linear or circular, between the head section and the base, at least one of the lines being formed by a crystal fiber with a longitudinal, linear electro-optical effect and consisting of a piezoelectric material which becomes birefringent in an electrical field. The supply and return lines may be of the same or different electro-optical material with the different materials selected to compensate for temperature induce birefringence. Also only one line need to be of the electro-optical material.

19 Claims, 8 Drawing Figures

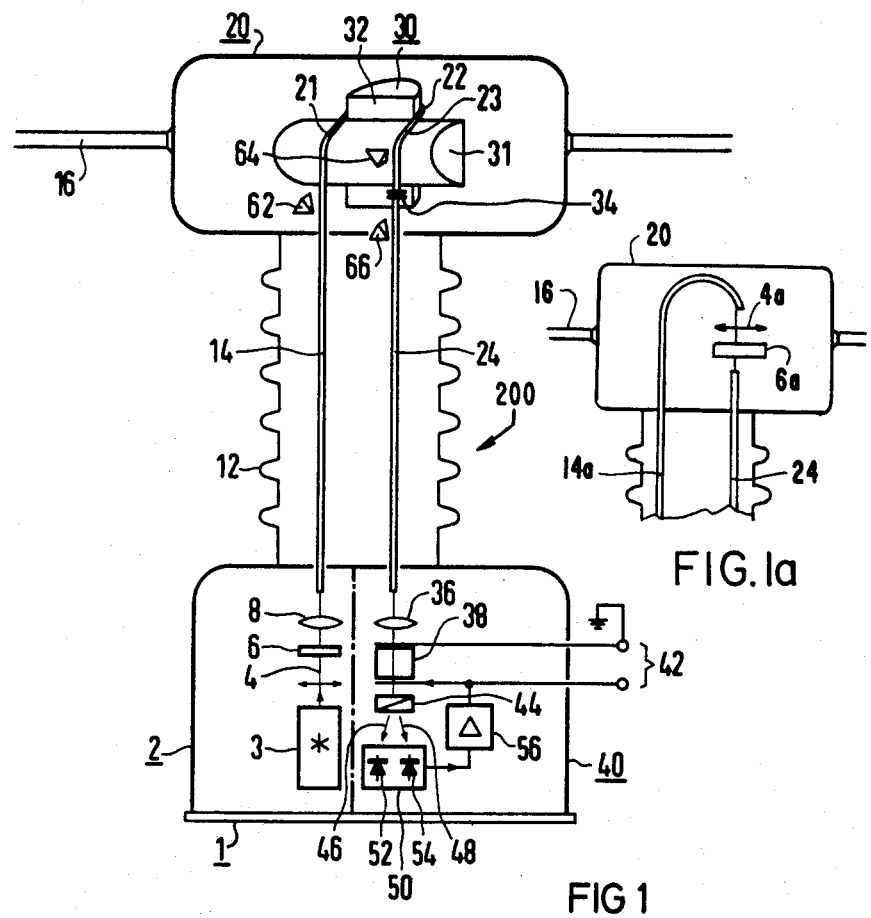
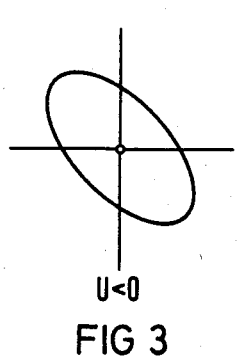
U<0
FIG 3
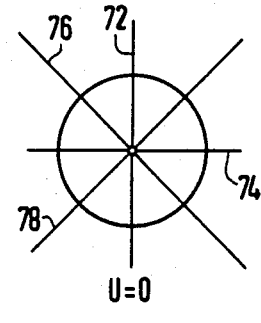
U=0
FIG 2
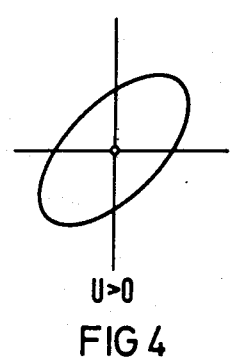
U>0
FIG 4

ELECTRO-OPTICAL VOLTAGE MEASUREMENT DEVICE

BACKGROUND OF THE INVENTION

The present invention is directed to a device for electro-optically measuring the voltage in a high voltage conductor, whose electrical field will elliptically polarize either a linearly polarized light beam or a circularly polarized light beam in a light conductor or guide and the device includes a receiver which will measure the voltage in response to the phase differences of the light beam components with different transit speeds in the light wave guide.

The dependency of the birefringence upon an external electric field is commonly disignated as an electro-optical effect. Upon transit through a birefringent medium, a linearly or a circularly polarized light beam is generally elliptically polarized. The components of the light wave or beam, which components are associated with the two main axes of the birefringent medium, will move through the medium with different speeds. The resulting phase difference is proportional to the distance traveled by the light beam in the crystal or medium and if the material has a linear electro-optical effect and the birefringence disappears when the field is not present, the amount of the phase difference is proportional to the electrical field. Thus, the phase difference can be utilized for measuring the field strength and for also measuring the voltage creating the field.

Methods for voltage measurements are known wherein the electrical field itensity E is determined with the electro-optical effect in unsymmetrical crystals or with the aid of a field influence on liquid crystals. However, only the electrical field intensity in the comparitive small crystal volume is thus determined.

SUMMARY OF THE INVENTION

The present invention is directed towards providing a measuring device wherein the voltage $U = \int E dl$ is integrated over a large distance l.

To accomplish this task, the present invention is directed to improvement in a device for electro-optically measuring a voltage in a high-voltage conductor, which voltage will produce an electrical field that will elliptically polarize both a linearly polarized light beam and a circularly polarized light beam, said device having a transmitter providing a source of light as a light beam, means polarizing the light beam, a head section at the high-voltage conductor and a receiver on a base which is spaced from the head section, said receiver having means for measuring the voltage due to a phase difference between the components of the light beams passing with different transit speeds. The improvement comprises the transmitter being on the base, a supply line extending from the source to the head and at least one return line for conducting the light beam having a desired polarization, which is either linear or circular, between the head section and the base, at least one of the lines being formed by a crystal fiber with a longitudinal, linear electro-optical effect and consisting of a piezoelectric material which becomes birefringent in an electrical field.

In the head section at a high-voltage conductor, the crystal fiber is preferably so guided that birefringence which is due to bending of the crystal fiber will be compensated and cancelled out.

In one embodiment, the supply line and return line are crystal fibers with the same properties but are connected with the crystal axes of the return line being oriented in relation to the crystal axes of the supply line so that the effects of birefringence in the supply and return lines are added and the phase displacement over the entire distance can be integrated. The measurement with this crystal fiber, which is birefringent in a electrical field, is independent of the field distribution on the entire length or distance of the fiber.

As a radiation source, a laser with a series connected polarizer is generally provided. Between the polarizer and the supply line a $\lambda/4$ plate which converts a linear polarization into a circular polarization is expediently provided. In a head section at the high voltage conductor, a return member is provided in which the crystal fiber is guided in a series of curves with each curve lying in a plane perpendicular to the plane of the adjacent curve in such a fashion that the induced birefringence, which is caused by the fiber curvature, is compensated for and cancelled out. In the receiver, the phase displacement is converted into a corresponding electrical magnitude or value which serves as a measurement of the voltage.

In one embodiment of the measuring device, the receiver is provided with a compensator, which compensates the birefringence produced in the crystal fibers. The compensator contains an electro-optical material, which will act birefringently at a very low voltage. The voltage of the compensator will be proportional to the voltage being measured and provides an output singal which serves as an indication of the amount of voltage that is to be determined. The compensator voltage is also proportional to the high voltage in the conductor when the phase displacement exceeds $2\pi$.

In certain instances, it may also be sufficient if only the supply line or the return line for the polarized light beam consists of a crystal which becomes birefringent in the electrical field.

In another embodiment, the supply line can be provided of a crystal fiber or material which depolarizes the light. In this embodiment, the polarizer and preferably a $\lambda/4$ plate are arranged in the head section at the high-voltage conductor so that the output from the supply line passes therethrough prior to being coupled into the return line. In this embodiment the construction of the measuring device, for example the return member of the head section, is greatly simplified.

In another embodiment of the device for electro-optically measuring the voltage, instead of a compensator for a phase demodulation, a second detector system and an evaluation circuit are provided. Each of the detector systems contains a beam divider prism and a pair of detectors which are allocated to the two partial beams or components of the beam produced by the beam divider. The light wave or beam in the return line is distributed between the two detector systems by a semi-reflective or transmitting mirror or reflector. Preferably, a $\lambda/4$ plate is connected in series with one of the detector systems. The beam divider prisms of each of the detector systems are oriented so that during a disappearance of the voltage U to be measured, the two beam intensities behind the first beam divider prism are equally great, whereas behind the second beam divider prism at a voltage $U=0$ only a component beam emerges.

Instead of a semi-transmitting or semi-reflecting mirror reflector, it is also possible to provide an additional light guide system, whose end is optically coupled with the input of the second detector system.

A technique for drawing the necessary long, thin crystals is know. An example of such a technique is disclosed in *J. Mat. Sci.* 7, 1972, pages 631, 649 and 787.

Since the crystal fiber is not intended to be birefringent without the application of an electrical voltage, materials having a cubic or tetragonal crystal structure are suitable. In the case of tetragonal crystal structures the c-axis must lie parallel to the fiber axis.

A longitudinally electro-optical effect occurs in these crystal systems, when the electro-optical coefficient $r_{63}$ does not disappear or when the relationship, $r_{13} - r_{23} \neq 0$, exists. As is known, this is the case of crystal class $T_d \equiv \overline{4}3m$ (See *Proc. IRE* 46, 1958, pages 764–778, in particular page 768). This property is possessed for example by sphalerite, ZnS; the copper halides, CuF and CuCl, among others, and Eulytine, $Bi_4(SiO_4)_3$. In addition the crystal class $t \equiv 23$ is suitable, for example, sodium chlorate $NaClO_3$, and the crystal class $D_{2d} \equiv \overline{4}2m$ is suitable, for example, potassium dihydrogen phosphate $KH_2PO_4$ and urea which is $CO(NH_2)_2$. The crystal class $S_4 \equiv \overline{4}$ is also suitable, for example, pentaerythrite, $C(CH_2OH)_4$.

If the refractive index for light, whose electric oscillation ($\hat{E}$ vector) is disposed perpendicular to the c-axis, without electrical field is uniformly $n_0$, i.e., it has no birefringence at voltage 0, then the birefringence occurs for materials from the crystal classes $T_d$, T, or $D_{2d}$ in an electrical field $E_z$, which is disposed parallel to the c-axis with the birefringence having the indices of refraction of $$n_0 + \frac{n_0^3 r_{63} E_z}{2} \text{ or }$$

$$n_0 - \frac{n_0^3 r_{63} E_z}{2}$$

for two perpendicularly disposed main axis directions in the [110]-direction and the [1̄10]-direction. Thus a birefringence of the magnitude of $n_0^3 r_{63} E_z$ results.

In the case of the crystal class $S_4$, a birefringence with a [100] orientation is superimposed on this effect due to the coefficients $r_{13} = -r_{23} \neq 0$. The main axes of the resulting birefringences therefore are disposed between the [100]-direction and the [1̄10]-direction. Since the polarity sign of the birefringence is dependent upon the polarity sign of the applied voltage, this linear effect can be utilized for a purpose of a voltage measurement.

BRIEF DESCRIPTION OF THE DRAWING

FIG. 1 is a schematic illustration of a sample embodiment of an electro-optic voltage measuring device in accordance with the present invention;

FIG. 1a is a partial schematic illustration of a variation of the embodiment of FIG. 1;

FIG. 2 graphically illustrates a circularly polarized beam of light when no birefringence is present;

FIG. 3 graphically illustrates consequences of birefringence on a circular polarized light when the voltage U < 0;

FIG. 4 is a graphic illustration of the effect of birefringence on a circular polarized light when the voltage U > 0;

DESCRIPTION OF THE PREFERRED EMBODIMENTS

Figure 5:
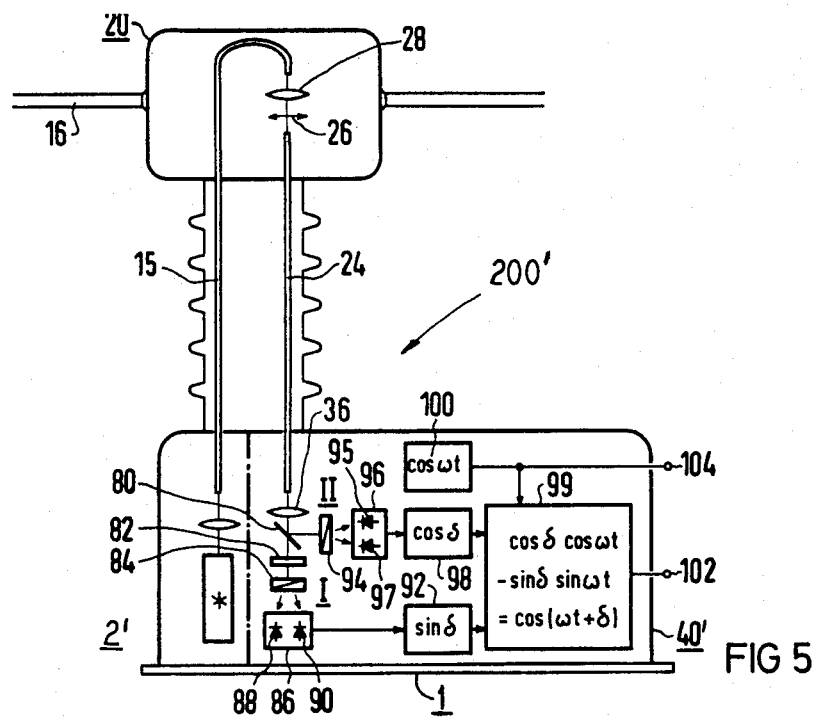
FIG. 5 schematically illustrates another embodiment of a measuring device in accordance with the present invention.

The principles of the present invention are particularly useful in a device which is generally indicated at 200 in FIG. 1 for electro-optically measuring a voltage in a high-voltage conductor such as 16.

The device 200 includes a base section 1, which is at zero potential and contains a transmitter 2 with a light source 3 for producing a polarized light beam 4. A λ/4 plate 6 is interposed between the source 3 and the input coupling optical or lens system 8. In a hollow insulator 12, a light conducting crystal fiber 14 is provided and consists of a piezoelectric material with a longitudinal linear electro-optical effect and which material will have birefringence induced therein by an electrical field from the high-voltage conductor 16. The fiber 14 forms an input line, which guides the light beam 4 to a head section 20, which is disposed on the high-voltage conductor 16, which may have a voltage for example of at least 220 kV. The head section 20 contains a return member 30, which consists of two semi-circular, cylindrical segments 31 and 32. It serves the purpose of guiding the crystal fiber 14 in several partial curves 21, 22 and 23 with each of the curves lying in a plane different than the plane of the adjacent curves. Between the crystal fiber 14 and a light conducting crystal fiber 24, which forms a return line, an optical coupling installation 34 is provided, which is of a known structure and is not illustrated in great detail.

At the end of the crystal fiber 24, a receiver 40 is arranged in the base or base section 1. The receiver 40 contains an output coupling optical or lens system 36 for coupling the light beam 4 through a compensator 38 at whose electrical output 42 a measured value can be tapped or removed. After passing through the compensator 38, the beam of light is received by a beam divider 44, which can be a Wollaston prism and divides the received light beam into component beams 46 and 48 which are polarized perpendicularly relative to one another. A detector device or arrangement 50 contains two detectors 52 and 54, with one detector for each of the two component beams and the output of each detector is connected to a differential amplifier whose output signal is supplied to the compensator 38 via an amplifier 56, which is preferably a power amplifier.

The light source 3 delivers a focused light beam 4 of linearly polarized light. The axis of polarization is indicated above the light source 3 by a double arrow. In certain cases, a polarizer, not illustrated, can be additionally arranged after the light source 3. The λ/4 plate 6 converts the linearly polarized light of the light source 3 into circularly polarized light. The optical axes of the λ/4 plate 6 are therefore rotated through + or −45 degrees, respectively, relative to the polarization direction of the light beam 4 which is supplied by the light source 3. The circularly polarized light beam 4 is input coupled into crystal fiber 14 via the input coupling optical or lens system 8, which is illustrated as a collective lens. The crystal fiber 14 traverses a distance between the light source 3 and the high-voltage conductor 16, whose voltage is to be measured. Via this distance, the voltage of the high voltage conductor 16 is to be integrated with the measuring device according to the invention.

Like every light guide, the crystal fiber 14 acts birefringently also without an electric field as soon as it is bent or curved. A curvature or bending between the supply line 14 and the return line 24 cannot be avoided. However, only the birefringence brought about by the voltage of the high voltage conductor 16 is to be measured. The crystal fiber 14 is therefore guided on the return member 30 which has the portions or segments 31 and 32 in such a fashion that the birefringence which is induced by the fiber curvature is compensated for and eliminated in a manner, such as is described, in the German O.S. No. 2,543,134, which was the basis for U.S. Pat. No. 4,070,622, and which disclosed an installation for current measurement through a determination of the Faraday-rotation by the magnetic field of the current-conducting guide. At the segments 31 and 32 of the return member 30, the crystal fiber 14 forms two quarter windings or curves 21 and 23 in a vertical directed plane with a half winding or curve 22 in a horizontal directed plane disposed therebetween. By means of this guidance of the crystal fiber, the birefringence brought about within the fiber due to the curvature is compensated and no additional birefringence due to bendng of the fiber will occur.

The crystal fibers 14 and 24 have the property of acting birefringently in the electric field. As a consequence a component of the light wave of the light beam 4 with a specific polarization plane has a higher transit speed in the crystal fibers 14, or 24, respectively, than the second component with a polarization perpendicular thereto. Through the different speeds of the components with polarization directions, which are perpendicular relative to one another, the phase displacement is obtained at the end of the fiber 24, which phase displacement serves as a measure of the voltage in the high-voltage line 16 which is to be measured.

In the coupling installation 34, the light wave of the light beam 4 in the fiber 14 is coupled into the second crystal fiber 24, which serves as the return line 24, by providing the coupling 34, the crystal orienation of the two fibers can be adjusted as desired. For example the crystal orientation of the fiber 24 is rotated through 90 degrees in relation to orientation of the crystal fiber 14.

The orienation of the crystal structure elements of the fiber 14 is indicated in the figure by a tetrahedron 62. The tetrahedron for example represents the arrangement of the four sulphur atoms which surround a zinc atom in the sphalerite ZnS. The change in the crystal orientation through the guidance of the crystal fiber 14 on the return member 30 is illustrated by an additional tetrahedron 64. By means of the coupling installation 34, the crystal axis is then rotated through 90 degrees, so that the return line 24 has the same crystal orientation as the supply line 14, and the effects of birefringence in the supply line 14 and the return line 24 are thereby added. The crystal orientation of the return line 24 is illustrated by an additional tetrahedron 66. By means of the coupling installation 34, two different fibers are thus obtained which make possible the addition of the birefringerence. Since the phase displacement of both polarization directions is proportional to the voltage in the high-voltage conductor 16, the phase displacement is thus a measurement of the voltage to be measured.

The main axes 72 and 74 of the birefringence extend perpendicular to each other as illustrated in FIG. 2. In the case of the voltage U=0 to be measured, the light waves polarized in the two main axes will have the same speed. Thus, the light beam is still circularly polarized as it leaves the end of the fiber 24, and the two detectors 52 and 54 of the receiver 40 of FIG. 1 receive component beams 46 and 48 which have the same intensity. The output signal of the detector 50 will be zero, and the amplifier 56 delivers no signal. With an increasing voltage in the conductor 16, an increasing phase difference will occur. Thus the light beam, which leaves the end of the line 24, will have an elliptical polarization whereby the orientation of the large axis of the ellipse is dependent upon the polarity or sign of the voltage that is being measured in the high-voltage conductor 16. If the voltage is U<0, then, as illustrated in FIG. 3, the light wave in the first fiber crystal axis 76 will have a greater amplitude than the amplitude in the second fiber crystal axis 78. If, however, the voltage is U>0, as illustrated in FIG. 4, a greater amplitude results in the second fiber crystal axis 78 than in the first axis 76.

As long as the compensator 38 does not compensate this ellipticity, the amplifier 56 will supply a signal whose polarity or sign is determined by the polarity or sign of the voltage that is being measured in the high-voltage conductor 16. If the amplification factor of the amplifier 56 is sufficiently great, the phase displacement will be compensated or corrected by the compensator 38. Therefore the compensator voltage will follow changes in the voltage to be measured, even when the phase displacement amounts to more than 360 degrees. The detector circuit 50 in the receiver 40 must be so rapid for this purpose that it can continuously follow the occurring phase displacement and that is prevents integral multiples of 360 degrees from not being registered. The voltage connected to the compensator 38 is proportional to the voltage creating the field on the crystal fibers 14 and 24 and thus the value at the output 42 can be utilized as a measurement of the voltage to be measured in the high voltage conductor 16.

If a longitudinal electro-optical effect is utilized also in the compensator 38, the ratio of the converter output voltage to the voltage to be measured in the conductor 16 is twice as great as the ratio of the half wave voltages of the compensator- and fiber-material.

Instead of using the two crystal fibers with an electro-optical effect for the supply line 14 and the return line 24, it is also possible for only one of the two lines, preferably the return line 24, to consist of an electro-optically effective fiber crystal. The supply line 14a (FIG. 1a) then consists of a non-depolarizing, but electro-optically inactive or ineffective light guide fiber, for example, a monomode fiber or a liquid core fiber.

It can furthermore be expedient to employ a depolarizing light conducting fiber, for example, a conventional multi-mode fiber, for the supply line 14a. The return line 24 will consist of a crystal fiber with an electro-optical effect. A polarizer 4a as well as an input coupling installation and a λ/4 plate 6a for generating the circularly polarized light are then advantageously arranged in the head section 20 on the high-voltage conductor 16. In this embodiment, a much simpler return member can be employed because only a half curve or circle is required between the supply line 14a and the return line 24. The assembly of the measuring device at the location of application can be simplified if additional couplings, not illustrated in Figures, are provided in the path of the fibers. In this embodiment, only the light guide sections or segments of the return line and possibly also of the supply line which extend through the hollow post insulator 12 must consist of crystal fibers, whereas the light guides in the field-free spaces of the head section and of the base section can be electro-optically inactive or ineffective glass—or liquid core—light guides, respectively.

An embodiment of the measuring device is generally indicated at 200′ in FIG. 5. The device 200′ has a base 1 with a transmitter 2′, which provides a source of light, and a special embodiment of a reciever 40′. An input line 15 is a depolarizing light guide fiber and extends from the transmitter 2′ to a head section 20′ at which the line or fiber 15 terminates in a single half circle or return bend by being guided over a simple return member (not illustrated). So that the light in the return line is polarized, an input coupling system 28 and a polarizer 26 are located in the head section 20′ and couple and polarize the light beam entering the return line 24.

The receiver 40′ contains two detector systems I and II as well as an evaluation circuit 99 with the aid of which it is possible to preclude or eliminate any ambiguity in the case of exceeding a phase displacement of 90 degrees. The light beam of the return line 24 is directed by an output coupling installation 36 at a beam splitter 80 which may be a semi-transmissive and semi-reflective mirror and creates a partial beam for the first detector system I and a partial beam for the second detector system II. A λ/4 plate 82 is arranged in series with the system I and the plate 82 will circularly polarize the light beam which is linearly polarized in the case of U=0. The system I contains a beam divider 84, for example a Wollaston prism, as well as a detector circuit 86 with two detectors 88 and 90 with one detector associated with each one of the component beams. Associated with the detector circuit 86 is a differential amplifier 92, whose output signal is proportional to the function sin δ, whereby δ is the angle of the phase displacement which results from the electro-optical birefringence. The detector system II receives the remaining portion of the light beam but does not have a λ/4 plate. The system II consists of a beam divider 94 as well as a detector circuit 96 with the detectors 95 and 97 for the two component beams and a differential amplifier 98 arranged thereafter whose output signal is proportional to cos δ. Without voltage on the high-voltage conductor 16, U=0, the detector system II thus receives linearly polarized light, and the detector system I receives circularly polarized light.

The voltage to be measured at the high-voltage conductor 16 effects the birefringence with a corresponding phase displacement in the crystal fiber 24, and the light beam in the input of the detector system II as well as a light beam in the input of the system I are elliptically polarized. The measurement in the receiver 40′ is based on this change. The evaluation circuit 99 contains a multiplier for the two detector systems I and II, respectively, as well as a common installation for difference or sum formation. From a high frequency generator 100, the evaluation circuit 99 is supplied in a known fashion, with a carrier frequency cos ωt, as well as the signal sin ωt, derived therefrom ("Measuring Current at extra-high Voltage" *Laser Focus*, May 1970, pages 35–38). A common 1-generator as in the known circuit is not necessary because the signals of the differential amplifiers 92 and 98 are already proportional to cos δ and sin δ. AS the output signal one obtains at the output 102 of the receiver 40′, a signal with the time dependency $$\cos\delta\cos\omega t - \sin\delta\sin\omega t = \cos(\omega t + \delta)$$

$$\cos\delta\cos\omega t + \sin\delta\sin\omega t = \cos(\omega t - \delta),$$

whereas, at the output 104, the carrier frequency cos ωt is obtained.

The embodiment of the phase modulation with the aid of a carrier frequency in the evaluation circuit 99, which deviates from the known arrangement, is based on the recognition that in the case of intensity fluctuations of the component beams in the detector systems I and II, also the generator for subtraction of the constants 1 would have to correspondingly jointly fluctuate in its intensity. However, this is possible only with a comparatively great outlay.

With the aid of the evaluation circuit 99, the high frequency a.c. voltage cos ωt, employed as the carrier frequency, is impressed with a phase displacement which corresponds to the optical phase displacement δ in the crystal fibers.

From the phase difference between the high-frequency voltages at the outputs 102 and 104, in a remote measuring station or control room, not illustrated in the figure, the phase displacement δ, and hence the voltage to be measured, can be reobtained with the aid of a phase meter.

If the amplitude modulation superimposed on the phase modulation interferes through fluctuations of the light intensity, the amplitude fluctuations can be eliminated in a known fashion, (See *Rev. Sci. Instrum.* 44, 1973, pages 742 to 743).

Deviating from the embodiment of the receiver 40′ according to FIG. 5, it is also possible to employ a separate analog-electronic circuit instead of each of the differential amplifiers 92 and 98. The output signals of the associated detectors 88 and 90, or 95 and 97, respectively, are then supplied to these analog-electronic circuits. If the output signals of the two detectors 88 and 90 are referenced with $U_1$ and $U_2$, respectively, and the output signals of the detectors 95 and 97 are referenced with $U_3$ and $U_4$, respectively, a signal $$S_1 \sim \frac{U_1 - U_2}{U_1 + U_2} = \sin\delta \text{ or,}$$

$$S_2 \sim \frac{U_3 - U_4}{U_3 + U_4} = \cos\delta$$

respectively, is then supplied by the respective analog-electronic circuit.

With a particularly advantageous embodiment of a device or arrangement for voltage measurement on a high-voltage conductor through utilization of the electro-optical effect (Pockels-Effect) in a light conducting crystal fiber, a compensation of the temperature dependency of the electro-optical effect of the crystal fibers can be obtained. In the embodiment of the device generally indicated at 200″ in FIG. 6, different fibers are used for the supply and return lines and are connected relative to one another in such a fashion that their temperature dependencies virtually compensate one another during the difference formation. In this embodiment, between the transmitter 2' of the base section 1 and the head section 20" on the high voltage conductor 16, four light conducting fibers are connected in series, of which the electro-optically active or effective crystal fibers 124 and 126 serve as first and second return lines, respectively. The first supply line 114 can, for example, consist of a non-electro-optical light conducting fiber, and a second supply line 116 can again consist of an electro-optically active crystal fiber. An input coupling optical system 28 as well as a polarizer 26 are disposed in the head section 20". The first and second return line 124 and 126, respectively, are now combined with the second supply line 116 through the selection of two different optically effective materials in such a fashion that their contributions to the temperature dependency of the measuring signal at least approximately compensate one another and the temperature dependency is cancelled out or substantially eliminated.

This embodiment is based on the recognition that the electro-optical coefficient $r_{63}$ is subject to the Curie-Weiss-Law which leads to the removal of the measuring signal with increasing temperature, and these different materials possess different temperature coefficients. The object of designing the voltage transducer or measuring device in such a manner that the temperature dependency is at least virtually compensated is now solved, for example, by using a crystal fiber with a strong electro-optical effect and a specific temperature dependency for the first return line 124 and the second supply line 116. A crystal fiber with a not significantly stronger electro-optical effect, but a significantly stronger temperature dependency is then employed for the second return line 126. In these fibers are coupled in such a manner that the electro-optical effect of the fiber 126 is subtracted from the sum of the electro-optical effects of the fibers 124 and 116, the temperature dependencies of the crystal fibers are at least approximately compensated, but not the electro-optical effects.

Between the supply line 114 and the return line 124 in the head section 20", only a simple return member is utilized which is not illustrated in the Figure. Between the return line 124 and the supply line 116, a coupling installation 128 is then required in order that the electro-optical effects over the line paths are added together or summed up. The change in the crystallograpic orientation of the fiber crystals is indicated by two different tetrahedrons 130 and 132. At the end of each of the first return line 124 and the second supply line 116, a return member is provided in the base section and the head section, respectively, and the return member are similar to the member 30 in FIG. 1. These return members effect a curvature of the fiber crystal with two quarter windings or curves in the vertical plane and a half winding or curve in the horizontal plane, and therefore compensate for the curvature-induced birefringence.

At the beginning of the second return line 126 a coupling installation 134 is provided. The relation of the crystallographic orientation of the two fibers of different material is indicated by the two tetrahedrons 136 and 138. The phase modulation circuit in the receiver 40" can, for example, be constructed in the same manner as the circuit illustrated for the receiver 40' in FIG. 5.

For potassium dihydrogen phosphate, $KH_2PO_4$, which in the following description is to be referenced with KDP, the electro-optical coefficient, for example, amounts to $$r_{63} = -\frac{1}{2}(1.0 + \frac{5400}{151 + T/°C.}) pm/V$$

(Landolt-Bornstein, *New Series Group III*, volume 1, page 144). For ammonium dihydrogen phosphate, $(NH_4)H_2PO_4$, which will be referenced in the following description with ADP, the electro-optical coefficient amounts to $$r_{63} = \frac{1}{2}(6.14 - \frac{10800}{317 + T/°C.}) pm/V.$$

From this, the temperature coefficients at 18° C. result $$\frac{1}{r} \frac{dr}{dT} = 5.74 \cdot 10^{-3} K^{-1} \text{ for } KDP \text{ and}$$

$$3.69 \cdot 10^{-3} K^{-1} \text{ for } ADP.$$

If in the device 200" a non-electro-optical supply line 114 is used, a KDP-crystal fiber is used for the second return line 126, and two ADP-crystal fibers are used for the first return line 124 and second supply line 116 and if the fibers are orientated at the coupling locations in such a fashion that the resulting phase difference amounts to $$\delta = \frac{2\pi}{\lambda} U (2n_{ADP}{}^3 r_{ADP} - n_{KDP}{}^3 r_{KDP})$$

then the temperature coefficient of the phase difference, while neglecting the temperature coefficient of the indices of refraction, is only $$\frac{d\delta}{\delta dT} = \frac{2n_{ADP}{}^3 dr_{ADP}/dT - n_{KDP}{}^3 dr_{KDP}/dT}{2n_{ADP}{}^3 r_{ADP} - n_{KDP}{}^3 r_{KDP}}$$

$$= \frac{2 \cdot 0.112 - 0.217}{2 \cdot 30.5 - 37.8} K^{-1} = 3.0 \cdot 10^{-4} K^{-1}.$$

Figure 6:
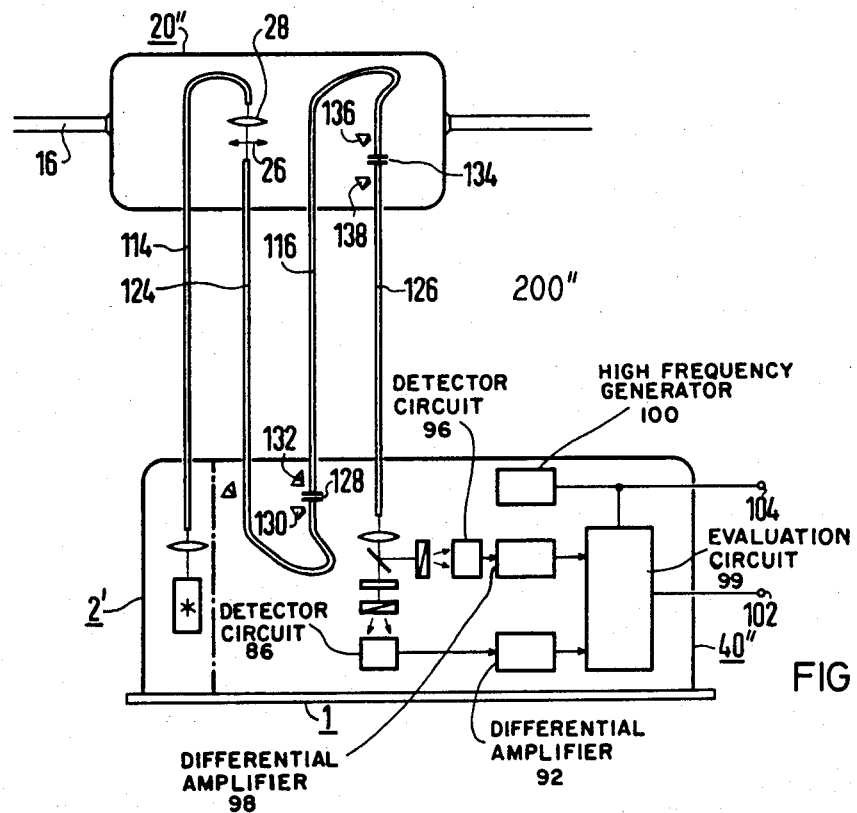
FIG. 6 schematically illustrates a third embodiment of a measuring device according to the present invention.
Figure 7:
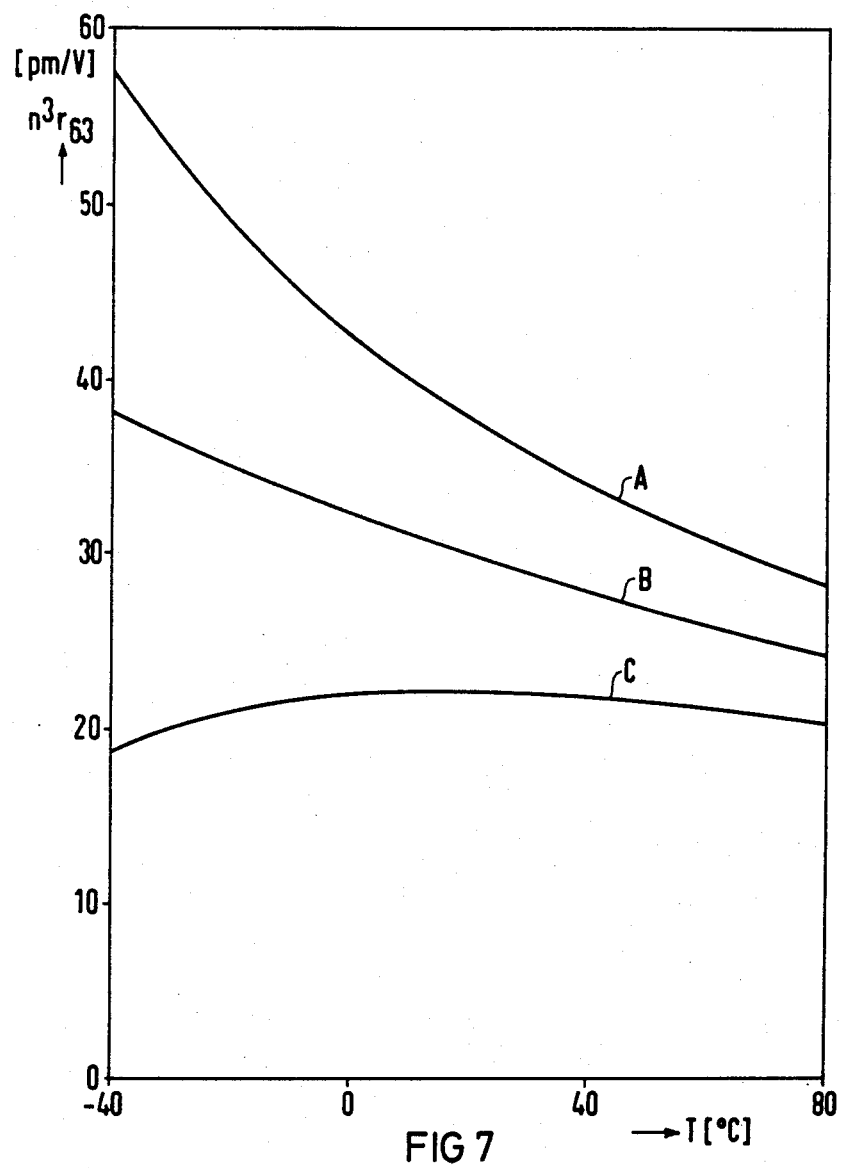
FIG. 7 shows curves for different materials showing their temperature dependent characteristics based on a temperature.

The diagram or graph in FIG. 7 plots the expression $n^3 r_{63}$ of the employed materials in pm/V in the y-axis and plots the temperature T in °C. on the x-axis. The curves A and B show the progression of the characteristic curve for $n_{KDP}{}^3 r_{KDP}$ and $n_{ADP}{}^3 r_{ADP}$ respectively and the combination of the two characteristic curves from two ADP-fibers and one KDP-fiber is shown by curve C. The connection of the fiber crystals as illustrated in FIG. 6 results in the progression of curve C. The temperature dependency of the magnitude $n^3 r_{63}$, which determines the electro-optical birefringence of the fiber crystals, is thus virtually compensated in the device 200" of FIG. 6.

Through the combination of a fiber of the material of the characteristic curve A with strong temperature dependency and a certain electro-optical effect with two fibers of the material of the characteristic curve B with only a slightly weaker electro-optical effect but approximately half as great a temperature dependency, the characteristic curve C is thus obtained for the unit of the three fibers connected in series. While the characteristic curve C indeed shows that the temperature dependencies are at least approximately compensated or eliminated, the electro-optical effects are not cancelled.

In addition to the possibility of compensating the temperature coefficients of the electro-optical birefringence with a device 200" of FIG. 6, there is also the possibility of achieving a compensation of the temperature dependency already with a supply line or a return line. For example, in the case of an arrangement of the crystal fibers according to FIG. 1, if one arranges, with a receiver according to FIG. 5, two crystal fibers of different materials, in contrast with FIG. 1, such that their electro-optically produced phase displacements are subtracted, the measuring signal at the output 42 of the receiver 40 is proportional to the magnitude $n^3r - n'^3r'$, whereby n and n' are the ordinary indices of refraction of the two different materials without electric voltage, and r or r', respectivley, are the electro-optical coefficients $r_{63}$ of the two different fiber crystals. The temperature coefficient of the measuring signal then amounts to $$\frac{1}{S} \frac{dS}{dT} = \frac{n^3 dr/dT - n'^3 dr'/dT}{n^3 r - n'^3 r'}.$$

For this embodiment, a material-pair is thus suitable for which the numerator in the right side of this equation is as small as possible, however, the denominator is not.

In a further embodiment of the arrangement for electro-optical voltage measurement with a compensator according to FIG. 1, the crystal fibers employed and the compensator must, in any case, consist of differnt electro-optically effective or active materials. In this case, as the measuring signal, one obtains a voltage $$U' = U \cdot \frac{n^3 r}{n'^3 r'},$$

if a longitudinal electro-optical effect is utilized also in the compensator. U is the voltage to be measured on the high voltage conductor. If the temperature dependency of the indices of refraction is again ignored, the temperature coefficient of the measuring signal in this case amounts to $$\frac{1}{U'} \frac{dU'}{dT} = \frac{1}{r} \frac{dr}{dT} - \frac{1}{r'} \frac{dr'}{dT}.$$

If the measuring signal is to be substantially smaller than the voltage to be measured, materials are suitable for this embodiment which have very different values of $n^3r$ but virtually equal temperature coefficients of the electro-optical effect.

Moreover, for the purpose of compensation of the temperature dependency, an embodiment with two different crystal fibers (n, r or n', r') and a compensator (n", r") corresponding to FIG. 1 is also possible. In this case the measuring signal amounts to $$U' = U \frac{n^3 r \pm n'^3 r'}{n''^3 r''}$$

and its temperature coefficient amounts to $$\frac{1}{U'} \frac{dU'}{dT} = \frac{n^3 dr/dT \pm n'^3 dr'/dT}{n^3 r \pm n'^3 r'} - \frac{1}{r''} \frac{dr''}{dT},$$

whereby the two polarity signs for the two possible crystal orientations of the crystal fibers relative to one another at the coupling locations are valid. This embodiment is preferably suited for material combinations in which the temperature coefficient is particularly small.

In addition to the embodiment of FIG. 6 with a double supply- and return-line, additional embodiments result by virtue of the fact that it is possible to also guide the light beam of the transmitter more that twice to the high voltage conductor at the head section and back to the base section, and that it is also possible to combine more than two different fiber materials with one another if the temperature coefficients for the fiber materials being used compensate for one another in this manner.

In the sample embodiment according to FIG. 1, a deflection or return member 30 is provided to prevent an additional birefringence which was induced by the curvature of the crystal fiber. However, it is also possible to allow the introduction of an additional birefringence into the crystal fiber 14 through the curvature in the head section 20 on the high-voltage conductor 16 and then compensate for this constant birefringence in the receiver.

Although various minor modifications may be suggested by those versed in the art, it should be understood that I wish to embody within the scope of the patent granted hereon, all such modifications as reasonably and properly come within the scope of my contribution to the art.

I claim:

1. In a device for electro-optically measuring a voltage in a high voltage conductor, which voltage produces an electrical field that will elliptically polarize both a linearly polarized light beam and a circularly polarized light beam, said device having a transmitter providing a source of a light as a light beam, means polarizing the light beam, a head section at the high voltage conductor, and a receiver on a base which is spaced from the head section, said receiver having a means for measuring the voltage due to a phase difference between the components of the light beams passing with different transit speeds the improvements comprising the transmitter being on the base, a supply line extending from the source to the head and a return line for conducting the light beam having a desired polarization, which is either linear or circular, between the head section and the base, said supply line and said return lines each being formed by a separate crystal fiber having a longitudinal, linear electro-optical effect and becoming birefringent in an electrical field, and the crystal orientation of the return line being rotated through 90 degrees relative to the crystal orientation of the supply line.

2. In a device according to claim 1, wherein the crystal fiber in the head section is guided in partial curves in such a fashion that the birefringence which is induced by bending the fiber are substantially eliminated.

3. In a device according to claim 1, wherein the head section has a return member for guiding the crystal fibers in partial windings with the windings being in series and in planes which are perpendicular relative to one another.

4. In a device according to claim 1, wherein a λ/4 plate is positioned between the input to the supply line and the source of the light beam.

5. In a device according to claim 1, wherein the electro-optical crystal of the supply line and the return line consist of different electro-optical effective materials so that birefringence variations induced by the temperature variations are approximately compensated and eliminated.

6. In a device according to claim 1, wherein the receiver contains a compensator having an output signal providing a measurement of the voltage being determined.

7. In a device according to claim 6, wherein at least the return line and the compensator consist of different electro-optically effective materials, said materials being selected so that temperature dependencies of the birefringence properties are approximately compensated and eliminated.

8. In a device according to claim 1, wherein the receiver has a first detector system and a second detector system, each detector system including a beam divider prism for dividing the light into two components of different polarization, and a detector for each of said components with the output of each detector of a system being connected to a differential amplifier, said receiver having means for splitting light entering from the return line into two partial beams with one partial beam directed to the first detector system and the second partial beam being directed to the second detector system, a λ/4 plate being arranged between the means for splitting and the beam divider prism of the first detector system, an evaluation circuit containing a multiplier for the two detector systems, a high-frequency generator producing a carrier frequency, said evaluation circuit modulating the carrier frequency with the output of the two detector systems to provide a difference or sumation products as an output signal.

9. A device according to claim 8, wherein the beam divider prism of the first detector system is oriented so that the output signal of the differential amplifier of the first system is proportional to sin δ, the beam divider prism of the second detector system is oriented so that the output signal of the differential amplifier of the second system is proportional to cos δ with the phase displacement δ of the electro-optical birefringence being proportional to the voltage to be measured.

10. In a device according to claim 1, which has a first supply line extending from the source to the head section, a first return line extending from the first line to the base, a second supply line extending from the end of the first return line back to the head section, and a second return line extending from the output of the second supply line to the receiver, at least two of the lines arranged in series consisting of at least two different electro-optical materials with the crystallographic orientation being arranged in such a fashion that the temperature coefficients of the electro-optical effects are at least approximately compensated for each other.

11. In a device according to claim 10, wherein the first supply line consists of an electro-optically ineffective material, that at least the remaining three lines are crystal fibers with two consisting of ammonium dihydrogen phosphate and one being formed of potassium dihydrogen phosphate, said three fibers being coupled in series with such a crystallographic orientation that the temperature coefficient of the electro-optical effect of each of the fibers are at least compensated for one another.

12. In a device for electro-optically measuring a voltage in a high voltage conductor, which voltage produces an electrical field that will elliptically polarize both a linearly polarized light beam and a circularly polarized light beam, said device having a transmitter providing a source of a light as a light beam, means polarizing the light beam, a head section at the high voltage conductor, and a receiver on a base which is spaced from the head section, said receiver having a means for measuring the voltage due to a phase difference between the components of the light beams passing with different transit speeds the improvements comprising the transmitter being on the base, a supply line extending from the source to the head and at least one return line for conducting the light beam having a desired polarization, which is either linear or circular, between the head section and the base, at least one of the lines being formed by a crystal fiber having a longitudinal, linear electro-optical effect and becoming birefringent in an electrical field and at least one of the lines being formed by a non-electro-optical effective fiber.

13. In a device according to claim 12, wherein the supply line is the non-electro-optically effective fiber, and wherein a polarizer and a λ/4 plate are interposed between the output of the supply line and the input to the return line in the head section.

14. In a device according to claim 12, which has a second supply line extending from the end of the return line back to the head section, and a second return line extending from the output of the second supply line to the receiver, at least two of the lines arranged in series consisting of at least two different electro-optical materials with the crystallographic orientation being arranged in such a fashion that a temperature coefficients of the electro-optical effects are at least approximately compensated for each other.

15. In a device according to claim 14, wherein the first mentioned supply line from the source to the head is said fiber of electro-optically ineffective material, that at least the remaining three lines are crystal fibers with two consisting of ammonium dihydrogen phosphate and one being formed of potassium dihydrogen phosphate, said three fibers being coupled in series with such a crystallographic orientation that the temperature coefficients of the electro-optical effect of each of the fibers are at least compensated for one another.

16. In a device according to claim 12, wherein the receiver contains a compensator having an output signal providing a measurement of the voltage being determined.

17. In a device according to claim 16, wherein at least the return line and the compensator consist of different electro-optically effective materials, said materials being selected so that temperature dependencies of the birefringence properties are approximately compensated and eliminated.

18. In a device according to claim 12, wherein the receiver has a first detector system and a second detector system, each detector system including a beam divider prism for dividing the light into two components of different polarization and a detector for each of said components with the output of each detector of a system being connected to a differential amplifier, said receiver having means for splitting light entering from the return line into two partial beams with one partial beam directed to the first detector system and the second partial beam being directed to the second detector system, a λ/4 plate being arranged between the means for splitting and the beam divider prism of the first detector system, an evaluation circuit containing a multiplier for the two detector systems, a high-frequency generator producing a carrier frequency, said evaluation circuit modulating the carrier frequency with the output of the two detector systems to provide a difference or summation products as an output signal.

19. A device according to claim 18, wherein the beam divider prism of the first detector system is oriented so that the output signal of the differential amplifier of the first system if proportional to sin δ, the beam divider prism of the second detector system is oriented so that the output signal of the differential amplifier of the second system is proportional to cos δ with the phase displacement δ of the electro-optical birefringence being proportional to the voltage to be measured.

* * * * *